(12) United States Patent
Kwon et al.

(10) Patent No.: US 9,818,974 B2
(45) Date of Patent: Nov. 14, 2017

(54) FLEXIBLE DISPLAY DEVICE (71) Applicant: LG Display Co., Ltd., Seoul (KR)

(72) Inventors: SeYeoul Kwon, Goyang-si (KR); Dojin Kim, Goyang-si (KR); YounYeol Yu, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/161,148

(22) Filed: May 20, 2016

(65) Prior Publication Data
US 2017/0179423 A1 Jun. 22, 2017

(30) Foreign Application Priority Data

Dec. 16, 2015 (KR) .................. 10-2015-0180277

(51) Int. Cl.
*H01L 51/52* (2006.01)
*H01L 27/32* (2006.01)
*G02F 1/1333* (2006.01)
*H01L 51/00* (2006.01)

(52) U.S. Cl.
CPC .... *H01L 51/5237* (2013.01); *G02F 1/133305* (2013.01); *H01L 27/323* (2013.01); *H01L 27/3276* (2013.01); *H01L 51/0097* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 7,859,633 B2* | 12/2010 | Park | G02F 1/13452 349/149 |
| 9,276,055 B1* | 3/2016 | Son | H01L 27/3276 |
| 9,287,329 B1* | 3/2016 | Lee | H01L 51/0097 |
| 9,379,355 B1* | 6/2016 | Lee | H01L 51/5253 |
| 2009/0021666 A1* | 1/2009 | Chen | G02F 1/133305 349/58 |
| 2013/0082984 A1* | 4/2013 | Drzaic | G09G 3/20 345/204 |
| 2013/0169515 A1 | 7/2013 | Prushinskiy et al. | |
| 2014/0042406 A1* | 2/2014 | Degner | H01L 27/326 257/40 |
| 2014/0092338 A1* | 4/2014 | Miyazaki | G02F 1/13452 349/58 |
| 2014/0152646 A1* | 6/2014 | Kang | G09G 3/2085 345/214 |
| 2014/0183473 A1* | 7/2014 | Lee | H01L 51/0097 257/40 |
| 2014/0217382 A1* | 8/2014 | Kwon | H01L 51/0097 257/40 |
| 2014/0240985 A1* | 8/2014 | Kim | H05K 1/028 362/249.04 |

(Continued)

OTHER PUBLICATIONS

European Search Report for European Patent Application No. EP 16204726.0, dated May 11, 2017, 9 Pages.

*Primary Examiner* — Andres Munoz
(74) *Attorney, Agent, or Firm* — Fenwick & West LLP (57) ABSTRACT

A flexible display device comprises a back plate coupled to a rear surface of a flexible display panel with a bending portion, having an opening portion overlapped with the bending portion; and a buffer member covering inner sides of the back plate, which are provided by the opening portion.

20 Claims, 4 Drawing Sheets

(56) References Cited

U.S. PATENT DOCUMENTS

| | | |
|---|---|---|
| 2015/0036300 A1 | 2/2015 | Park et al. |
| 2015/0263300 A1 | 9/2015 | Namkung et al. |
| 2016/0035759 A1* | 2/2016 | Kwon ................ H01L 27/1244 257/40 |
| 2016/0093644 A1* | 3/2016 | Ki .................... H01L 29/78672 257/40 |
| 2016/0093685 A1* | 3/2016 | Kwon ................ H01L 27/3276 257/40 |
| 2016/0155788 A1* | 6/2016 | Kwon ................ H01L 27/3276 257/40 |
| 2016/0172427 A1* | 6/2016 | Lee .................... H01L 27/3276 257/40 |
| 2016/0172428 A1* | 6/2016 | Song .................. H01L 51/0097 257/99 |
| 2016/0172623 A1* | 6/2016 | Lee .................... H01L 51/5253 257/40 |
| 2016/0181345 A1* | 6/2016 | Lee .................... H01L 27/3276 257/40 |
| 2016/0181346 A1* | 6/2016 | Kwon ................ H01L 27/3276 257/40 |

* cited by examiner

FLEXIBLE DISPLAY DEVICE

CROSS REFERENCE TO RELATED APPLICATION

This application claims the benefit of Republic of Korea Patent Application No. 10-2015-0180277 filed on Dec. 16, 2015, which is hereby incorporated by reference for all purposes as if fully set forth herein.

BACKGROUND OF THE INVENTION

Field of the Invention

The present invention relates to a display device, and more particularly, to a flexible display device.

Discussion of the Related Art

Generally, display devices are widely used as display screens of various products such as televisions, notebook computers and monitors as well as portable electronic devices such as mobile communication terminals, electronic diaries, electronic books, portable multimedia players (PMPs), navigators, ultra mobile PCs (UMPCs), mobile phones, smart phones, tablet PCs (Personal Computers), and watch phones.

Since an organic light emitting display device and an electrophoresis display device of the display devices may be manufactured in a thin type, studies and developments for realizing them as flexible display devices have been made. The flexible display device includes a display portion, a line, etc., which are formed on a flexible substrate, wherein the display includes a thin film transistor. The flexible display device may display images even though it is curved like a piece of paper, whereby the flexible display device may be used in various display fields.

A general flexible display device has a bezel width due to a mechanism for masking a panel driving circuit connected to a pad portion provided in a non-display portion of a flexible substrate.

SUMMARY OF THE INVENTION

Embodiments relate to a flexible display device including a flexible substrate, a pixel array portion, a first back plate, a second back plate and a first buffer member. The flexible substrate includes a flat display portion, a circuit connection portion and a bending portion between the flat display portion and the circuit connection portion. The pixel array portion is on the first side of the flat display portion of the flexible substrate. The first back plate is attached to a first portion of the second side of the flexible substrate in the flat display portion. The second back plate is attached to a second portion of the second side of the flexible substrate in the circuit connection portion. The first buffer member extends into a part of the bending portion from a side of the first back plate facing the bending portion. The first buffer member defines an opening on the second side of the flexible substrate in the bending portion between the first back plate and the second back plate.

In one embodiment, the circuit connection portion includes a pad portion for connecting to a flexible circuit film, and the bending portion is folded back so that the first portion of the second side of the flexible substrate faces the second portion of the second side of the flexible substrate.

In one embodiment, the first back plate and the second back plate are parallel when the bending portion is folded back, and the second back plate extends over a part of the second portion of the flexible substrate.

In one embodiment, a width of the second plate is larger than a bezel width of the flexible substrate.

In one embodiment, the flexible display device further includes a second buffer member extending into a part of the bending portion from a side of the second back plate. The second buffer portion in conjunction with the first buffer portion defines the opening.

In one embodiment, the first buffer member and the second buffer member are separated by a distance when the bending portion is not bent, and the first buffer member and the second buffer member are in contact when the bending portion is bent.

In one embodiment, the first buffer member covers a portion of a rear surface of the first back plate, and the second buffer member covers a portion of a rear surface of the second back plate.

In one embodiment, the thickness of a portion of the first buffer member covering the portion of the rear portion of the first back plate is at most $\frac{1}{10}$ of a thickness of the first back plate.

In one embodiment, the flexible display device further includes a signal transmission line in the bending portion, and a cover layer covering the bending portion in the signal transmission line.

In one embodiment, the cover layer extends over the circuit connection portion and the pixel array portion when the bending portion is bent.

In one embodiment, the flexible display device further includes a pixel array layer on the first portion of the flexible substrate, an encapsulation layer on the pixel array layer and a barrier layer on the encapsulation layer. The encapsulation layer contacts the cover layer.

In one embodiment, the first and second buffer members are formed by coating the side of the first back plate and the side of the second back plate with a polymer material and hardening the polymer material into predetermined shapes.

In one embodiment, the first and second buffer members include an anti-water permeable material to prevent water from permeating into the flexible substrate.

In one embodiment, the flexible display device further includes a printed circuit board connected to the pad portion via the flexible circuit film. The printed circuit board is secured to the first back plate.

In one embodiment, the printed circuit board is secured to the first back plate by one of a foam tape, a double-sided tape or a single-sided tape.

In one embodiment, the printed circuit board is secured to the first back plate by an adhesive member between the printed circuit board and the first back plate.

In one embodiment, the flexible display device further includes an adhesive member between the first back plate and the second back plate.

In one embodiment, the flexible display device further includes a cover window having a front cover and side covers at both sides of the front cover. The pixel array portion is bonded to a lower surface of the front cover, and the bending portion is bent in a curved shape and surrounded by the side covers.

In one embodiment, the flexible display device further includes a touch electrode portion arranged between the cover window and the pixel array portion.

In one embodiment, the flexible display device further includes a touch electrode portion arranged between the cover window and the pixel array portion.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms. Also, it should be understood that the term such as "include" or "have" does not preclude existence or possibility of one or more features, numbers, steps, operations, elements, parts or their combinations. It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, preferred embodiments of a flexible display device according to the present invention will be described in detail with reference to the accompanying drawings. Wherever possible, the same reference numbers will be used throughout the drawings to refer to the same or like parts. Also, in the following description of the present invention, if detailed description of elements or functions known in respect of the present invention is determined to make the subject matter of the present invention unnecessarily obscure, the detailed description will be omitted.

Figure 1:
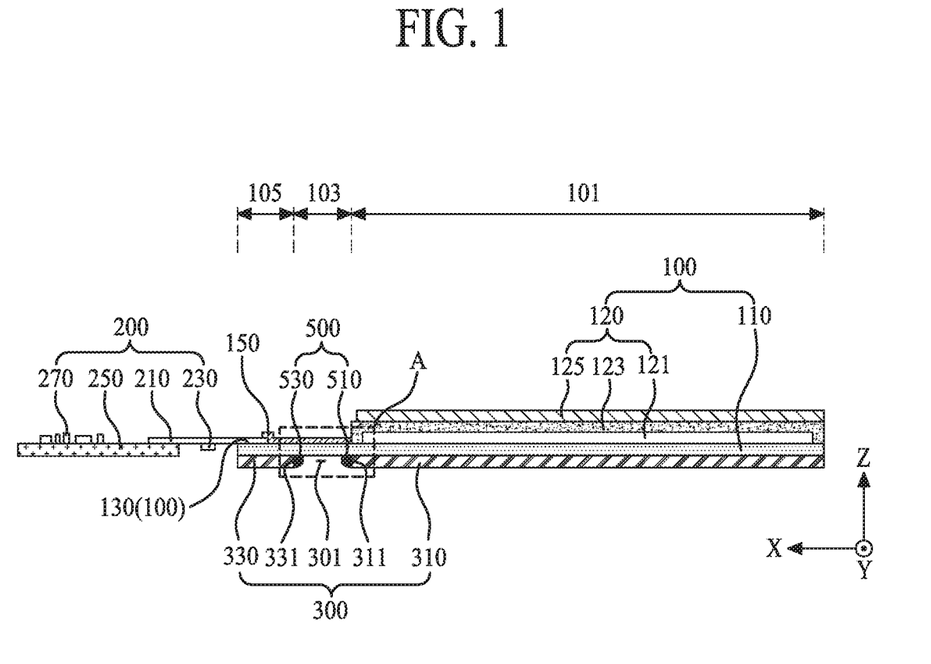
FIG. 1 is a cross-sectional diagram illustrating a flexible display device according to one embodiment.
Figure 2:
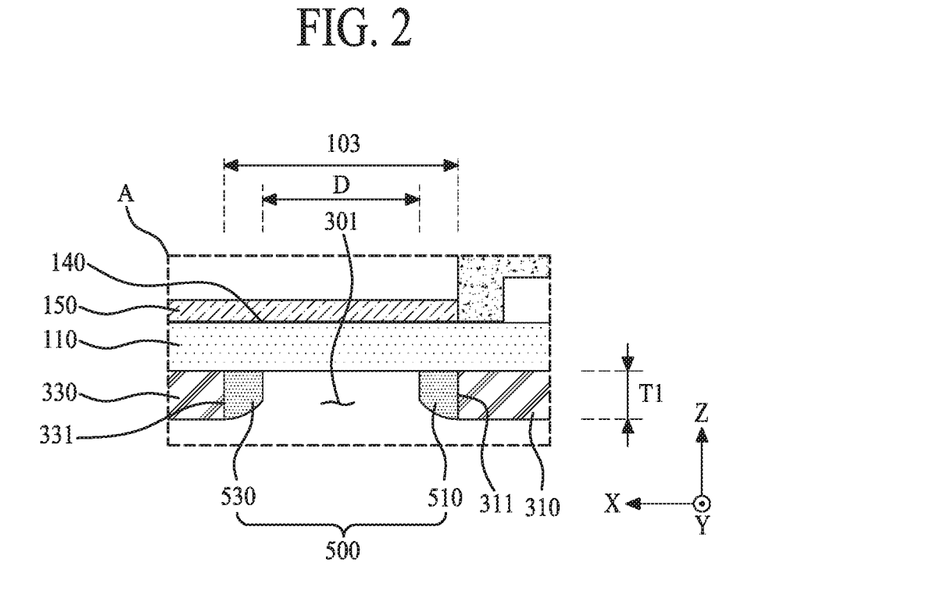
FIG. 2 is an enlarged sectional diagram illustrating a portion of FIG. 1.

FIG. 1 is a sectional diagram illustrating a flexible display device according to one embodiment of the present invention, and FIG. 2 is an enlarged sectional diagram illustrating a portion A of FIG. 1. Referring to FIGS. 1 and 2, the display device according to one embodiment of the present invention includes a flexible display panel 100, a back plate 300, and a buffer member 500.

The flexible display panel 100 may be a display panel of a flexible flat panel display device. In the following description, it is assumed that the flexible display panel 100 is a flexible organic light emitting display panel of the flexible flat panel display device.

The flexible display panel 100 according to one embodiment includes a flexible substrate 110, a pixel array portion 120, and a pad portion 130. The flexible substrate 110 includes a display portion 101, a bending portion 103, and a circuit connector 105. The display portion 101 has a relatively wide area, and the circuit connector 105 is provided at one edge portion of the flexible substrate 110. The bending portion 103 is provided between the display portion 101 and the circuit connector 105.

The flexible substrate 110 may include a flexible plastic material to bend the bending portion 103 in a curved shape. For example, the flexible substrate 110 may include any one or more of the following materials: poly carbonate, poly methylpentene, poly methyl methacrylate, cycloolefin copolymer, and polyimide. More preferably, the flexible substrate 110 may include an opaque or colored polyimide material. This flexible substrate 110 may be formed by hardening of a plastic material coated on a release layer at a certain thickness, wherein the release layer is formed on a carrier substrate (not shown) which is relatively thick. In this case, the carrier substrate is separated from the flexible substrate 110 by release of the release layer using a laser release process.

The pixel array portion 120 is provided on the flexible substrate 110 to display images. The pixel array portion 120 according to one embodiment includes a pixel array layer 121, an encapsulation layer 123, and a barrier layer 125.

The pixel array layer 121 includes a plurality of pixels which are provided in pixel regions defined by pixel driving lines provided on the display portion 101 of the flexible substrate 110 and display images in accordance with signals supplied to the pixel driving lines. The pixel array layer 121 according to one embodiment includes a thin film transistor, an anode electrode, an organic light emitting diode and a cathode electrode, which are not shown.

The thin film transistor is provided in a transistor region of each pixel region defined on the flexible substrate 110, and may include a gate electrode, a gate insulating film, a semiconductor layer, a source electrode, and a drain electrode. In this case, the thin film transistor (TFT) may be an a-Si TFT, a poly-Si TFT, an Oxide TFT, or an Organic TFT.

The anode electrode is provided in an opening region defined in each pixel region in a shape of a pattern and connected to the thin film transistor.

The organic light emitting diode is formed on the anode electrode provided in the opening region. Although not shown, the organic light emitting diode may be formed in a structure that a hole injecting layer, a hole transporting layer, an organic light emitting layer, an electron transporting layer and an electron injecting layer are sequentially deposited. In this case, one or two or more of the hole injecting layer, the hole transporting layer, the electron transporting layer and the electron injecting layer may be omitted. The organic light emitting layer may be formed to emit same colored light, for example, white color for each pixel, or may be formed to emit different colored light, for example, red, green and blue light different for each pixel.

The cathode electrode is commonly connected to the organic light emitting diodes provided in the respective pixel regions.

The encapsulation layer 123 prevents water from permeating into each pixel, and is formed to cover the pixel array layer 121. The encapsulation layer 123 may be formed of an organic material layer or an inorganic material layer, or may be formed in a multi-layered structure that the organic material layer and the inorganic material layer are alternately deposited.

The barrier layer 125 is provided on the encapsulation layer 123 and prevents water from being permeated into the display flexible display panel 100. The barrier layer 125 is preferably made of a material having low water permeability, for example, polymer material.

Additionally, the flexible display panel 100 may include a polarizing film (not shown) instead of the barrier layer 125, or may further include a polarizing film arranged on the barrier layer 125. The polarizing film polarizes light emitted from each pixel of the pixel array portion 120 or prevents external light from being reflected, thereby improving the optical property of the flexible display panel 100.

The bending portion 103 of the flexible substrate 110 is defined between the pad portion 130 and the pixel array portion 120. To reduce a side bezel width of the display device, the bending portion 103 is bent in a curved shape such that the circuit connector 105 is arranged on a rear surface of the flexible display panel 100.

The pad portion 130 includes a plurality of pad electrodes (not shown) provided on the circuit connector 105 of the flexible substrate 110. Each of the plurality of pad electrodes is connected with a driving signal line of the pixel array portion 120 through the signal transmission line 140. The pad portion 130 is connected with a panel driving circuit 200 to supply a signal supplied from the panel driving circuit 200 to the pixel array portion 120 through the signal transmission line 140.

The panel driving circuit 200 is connected to the pad portion 130 provided in the flexible display panel 100 to provide a signal for driving each pixel to the pad portion 130. The panel driving circuit 200 according to one embodiment includes a flexible circuit film 210, a driving integrated circuit 230, and a printed circuit board 250.

The flexible circuit film 210 is attached to the pad portion 130 of the flexible display panel 100 through a film attachment process.

The driving integrated circuit 230 is packaged in the flexible circuit film 210 by a chip bonding process or surface packaging process. The driving integrated circuit 230 generates a data signal and a gate signal on the basis of image data and timing synchronization signal supplied from an external display driving system and display images in each pixel.

Selectively, the driving integrated circuit 230 may be packaged in either the printed circuit board 250 or the circuit connector 105 of the flexible substrate 110 without being packaged in the flexible circuit film 210. In this case, the flexible circuit film 210 serves to relay signal transmission between the pad portion 130 and the display driving system.

The printed circuit board 250 is connected with the flexible circuit film 210. This printed circuit board 250 includes a driving circuit portion 270.

The driving circuit portion 270 generates image data and timing synchronization signal corresponding to images, which will be displayed in the pixel array portion 120, to provide the generated image data and timing synchronization signal to the driving integrated circuit 230, and generates a voltage required for driving of the pixel array portion 120 and/or the driving integrated circuit 230.

Selectively, the driving circuit portion 270 may be made of one driving chip that includes a driving integrated circuit 230.

The back plate 300 is formed to have an opening portion 301 overlapping with the bending portion 103 defined in the flexible substrate 110 and coupled to the rear surface of the flexible display panel 100 to support the flexible display panel 100. The back plate 300 is attached to the rear surface of the other flexible substrate 110 except the bending portion BP of the flexible substrate 110 by a lamination process after the laser release process for separating the carrier substrate from the flexible substrate 110. The back plate 300 maintains the pixel array portion 120 of the flexible display panel 100 in a flat state. The bending portion 103 of the flexible substrate 110 may be bent at a predetermined curvature because the lack of laminated material in the opening portion 301. The back plate 300 according to one embodiment may include any one of the following materials: PET(polyethyleneterephthalate), PC(polycarbonate), PES (polyethersulfone), PEN(polyethylenapthanate), and PNB (polynorborneen).

The opening portion 301 is provided by partially removing the back plate 300 on the bending portion 103 of the flexible substrate 110. The bending portion 103 can be bent at a predetermined curvature by exposing a rear surface of the bending portion 103.

The back plate 300 according to one embodiment includes a first back plate 310 and a second back plate 330. The first back plate 310 is attached to the rear surface of the flexible display panel 100 overlapping with the display portion 101 of the flexible display panel 100. That is, the first back plate 310 in the shape of a flat panel is attached to the rear surface of the flexible substrate 110, to overlap with the display portion 101 of the flexible substrate 110. The first back plate 310 maintains the pixel array portion 120 in a flat state by supporting the pixel array portion 120 provided in the flexible substrate 110.

The second back plate 330 is attached to the rear surface of the flexible display panel 100 overlapping with the circuit connector 105 of the flexible display panel 100. That is, the second back plate 330 is in the shape of a flat panel is attached to one edge rear surface of the flexible substrate 110, to overlap with the circuit connector 105 of the flexible substrate 110. The second back plate 330 maintains one edge of the flexible substrate 110, which includes the circuit connector 105, in a flat state by supporting the circuit connector 105 of the flexible substrate 110.

The opening portion 301 is provided between the first and second back plates 310 and 330 to allow the bending portion 103 of the flexible substrate 110 to be bent at a predetermined curvature by externally exposing the rear surface of the bending portion 103.

The buffer member 500 covers each of first and second inner sides 311 and 331 of the back plate 300 facing the bending portion 103. The first and second inner sides 311 and 331 of the back plate 300 are parallel to each other and are located adjacent to the opening portion 301 of the flexible substrate 110. The first inner side 311 of the back plate 300 is provided adjacent to the opening portion 301, and overlaps with a boundary surface between the display portion 101 and the bending portion 103 of the flexible substrate 110 in the direction of a vertical axis direction Z. Also, the opening portion 301 separates the second inner side 331 of the back plate 300 and the first inner side 311 of the back plate 300, and overlaps with a boundary surface between the bending portion 103 and the circuit connector 105 of the flexible substrate 110 in the direction of the vertical axis direction Z.

The buffer member 500 is coated on each of the first and second inner sides 311 and 331 of the back plate 300 and hardened to have a predetermined shape, thereby covering each of the first and second inner sides 311 and 331 of the back plate 300. Therefore, the buffer member 500 prevents the flexible substrate 110 from scratches and reduces bending stress concentrated on the bending portion 103 of the flexible substrate 110 by preventing edges of the first and second inner sides 311 and 331 of the back plate 300 from coming into contact with the flexible substrate 110 during bending of the flexible substrate 110. Also, the buffer member 500 is coupled to the first and second inner sides 311, 331 of the back plate 300 and the rear surface of the flexible substrate 110 adjacent to the first and second inner sides 311, 331 to cover or seal a coupling portion (or attaching portion) between the flexible substrate 110 and the back plate 300, thereby preventing the separation between the flexible substrate 110 and the back plate 300 and at the same time preventing water permeation between the flexible substrate 110 and the back plate 300.

The buffer member 500 may include a polymer material for buffering, for example, polyacrylic based material. Also, the buffer member 500 has a thickness less than a total thickness T1 of the back plate 300 so as not to increase a total thickness of the flexible display device.

Additionally, the buffer member 500 may further include an anti-water permeation material, and may effectively prevent water from permeating into the flexible substrate 110. That is, if water permeates into the coupling portion (or attaching portion) between the flexible substrate 110 and the back plate 300, separation between the flexible substrate 110 and the back plate 300 may occur. For this reason, the buffer member 500 includes an anti-water permeation material to prevent water from permeating between the flexible substrate 110 and the back plate 300, thereby preventing separation between the flexible plate 110 and the back plate 300. For example, the anti-water permeation material may include a silicon material of which thermal stability, adhesive and anti-water permeation functions are excellent. The anti-water permeation material may be coated on the other surface, which is not coupled to the flexible substrate 110 and the back plate 300, at a predetermined thickness.

The buffer member 500 according to one embodiment includes a first buffer member 510 and a second buffer member 530. The first buffer member 510 covers the first inner side 311 of the back plate 300, which is provided by the opening portion 301 of the back plate 300, more specifically the first inner side 311 of the first back plate 310. That is, the first buffer member 510 is provided at one side of the opening portion 301 and covers a portion between the rear surface of the flexible substrate 110 exposed to the opening portion 301 and the first inner side 311 of the first back plate 310. Therefore, the first buffer member 510 covers the first inner side 311 of the first back plate 310 and the rear surface of the flexible substrate 110 corresponding to one side of the opening portion 301, thereby preventing the flexible substrate 110 from being scratched due to the contact between the rear surface of the flexible substrate 110 and the edge portion of the first inner side 311 of the first back plate 310 during bending of the flexible substrate 110 as well as reduce bending stress concentrated on the flexible substrate 110.

The second buffer member 530 covers the second inner side 331 of the back plate 300, which is provided by the opening portion 301 of the back plate 300, more specifically the second inner side 331 of the second back plate 330. That is, the second buffer member 530 is provided at the other side of the opening portion 301 and covers a portion between the rear surface of the flexible substrate 110 exposed to the opening portion 301 and the second inner side 331 of the second back plate 330. Therefore, the second buffer member 530 covers the second inner side 331 of the second back plate 330 and the rear surface of the flexible substrate 110 corresponding to the other side of the opening portion 301, thereby preventing the flexible substrate 110 from being scratched due to the contact between the rear surface of the flexible substrate 110 and the edge portion of the second inner side 331 of the second back plate 330 during bending of the flexible substrate 110 as well as reducing bending stress concentrated on the flexible substrate 110.

Figure 4:
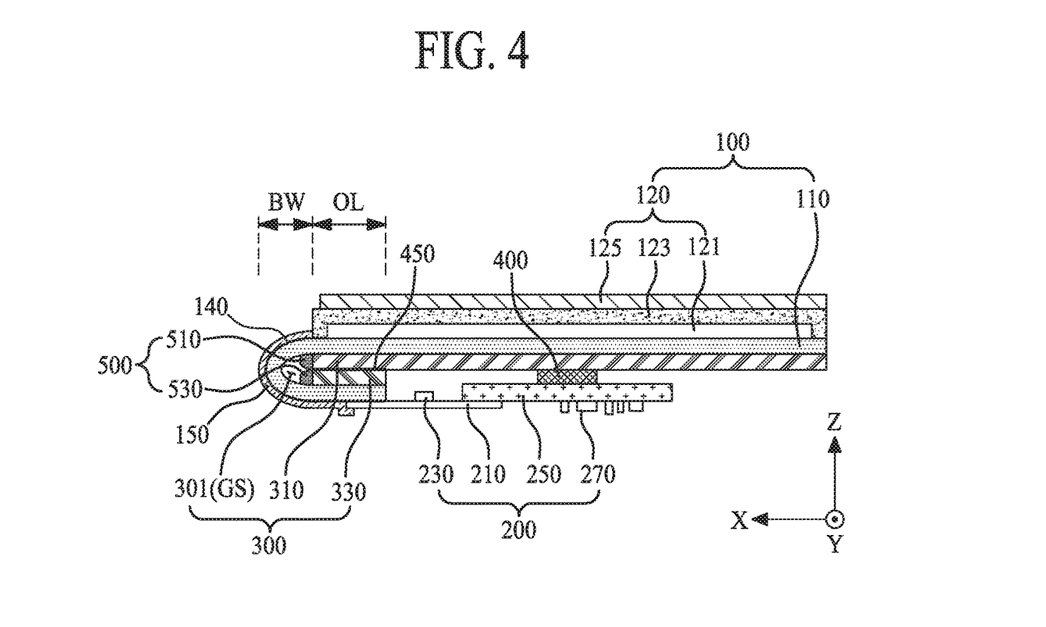
FIG. 4 is a sectional diagram illustrating a bending state of a flexible display panel according to one embodiment.

The first and second buffer members 510, 530 are provided in parallel with each other to be spaced apart from each other at a predetermined distance D such that the bending portion 301 of the flexible substrate 110 may be bent in a curved shape having a predetermined curvature. The distance D between the first and second buffer members 510 and 530 may be set in accordance with a bending curvature of the bending portion 301. Therefore, each of the first and second buffer members 510 and 530 serves as buffers while guiding bending of the bending portion 301. Therefore, a separate support member for bending of the bending portion 301 is obviated. As a result, a flexible display device having a narrow bezel width BW and a thin thickness can be achieved. The bezel width BW is herein defined as a distance from an edge of the encapsulation layer 123 to an outer edge of the bending portion 301 when the bending portion 301 is bent, as illustrated in FIG. 4.

Figure 3:
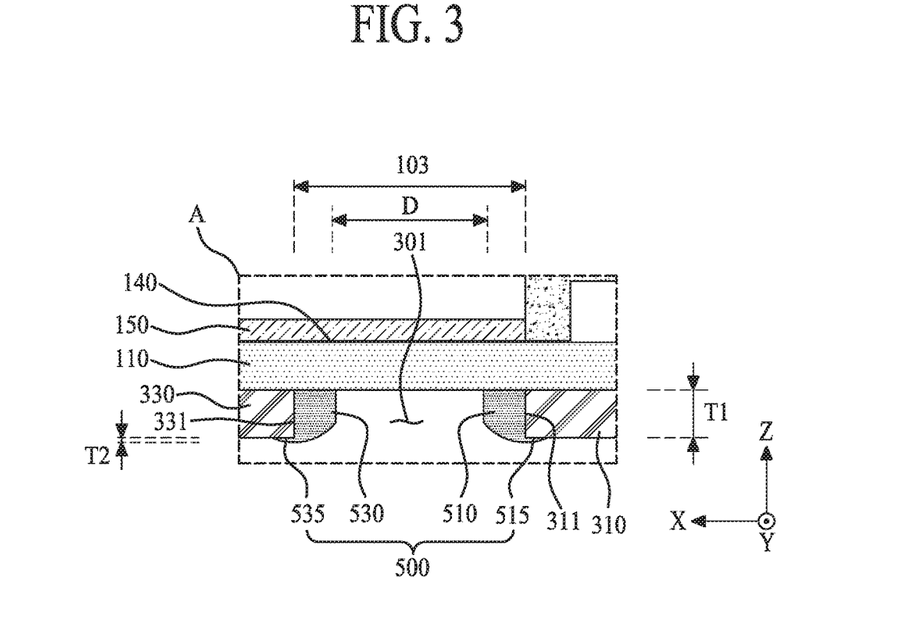
FIG. 3 is a sectional diagram illustrating an extension portion according to one embodiment.

Additionally, as shown in FIG. 3, the first buffer member 510 includes a first extension portion 515, and the second buffer member 530 includes a second extension portion 535.

The first extension portion 515 is provided to additionally cover a rear edge portion of the first back plate 310, which is adjacent to the first inner side 311 of the first back plate 310. That is, the first extension portion 515 extends over the first inner side 311 of the first back plate 310 and covers a part of the rear surface of the first back plate 310 adjacent the opening portion 301 of the back plate 300. The first extension portion 515, as described later, minimizes interference between the rear surface of the second back plate 330 arranged on the rear surface of the first back plate 310 and the rear surface of the first back plate 310 in accordance with bending of the bending portion 103, and buffers external impact provided between the first and second back plates 310 and 330.

The first extension portion 515 may have a thickness T2 corresponding to 1/10 of the total thickness T1 of the back plate 300, and if the first extension portion 515 has a thickness T2 more than the total thickness T1 of the back plate 300, the thickness of the flexible display device is increased.

The second extension portion 535 is provided to additionally cover a rear edge portion of the second back plate 330 adjacent to the second inner side 331 of the second back plate 330. That is, the second extension portion 535 extends over the second inner side 331 of the second back plate 330 and covers a portion of the second rear surface of the second back plate 330 adjacent to the opening portion 301 of the back plate 300. The second extension portion 535, as described later, minimizes interference between the rear surface of the second back plate 330 arranged on the rear surface of the first back plate 310 and the rear surface of the first back plate 310 in accordance with bending of the bending portion 103, and buffers external impact provided between the first and second back plates 310 and 330.

The second extension portion 535 may have a thickness T2 corresponding to 1/10 of the total thickness T1 of the back plate 300 in the same manner as the first extension portion 515, and if the second extension portion 535 has a thickness T2 more than the total thickness T1 of the back plate 300, the thickness of the flexible display device is increased.

Additionally, the flexible display device according to one embodiment of the present invention may further include a cover layer 150 on the flexible substrate 110 to cover the bending portion 103 of the display panel 100. The cover layer 150 covers the pixel array portion 120 and a portion between the circuit connector 105. The cover layer 150 may contact the encapsulation layer 123 at its one side. The circuit connector 105 includes the pad portion 130, and the display portion 110. The cover layer 160 includes a polymer material, and is coated on the bending portion 103 of the flexible substrate 110 to cover the signal transmission line 140 between the pixel array portion 120 and the pad portion 130. The cover layer 160 protects the signal transmission line 140 from external impact and prevents water from being permeated into the signal transmission line 140. Particularly, the cover layer 160 serves to dispose the signal transmission line 140 on a neutral plane when the bending portion 103 of the flexible display panel 100 is bent in a curved shape having a predetermined curvature. That is, when the bending portion 103 of the flexible display panel 100 is bent at a predetermined curvature, a neutral plane where tensile and compressive powers are 0 (zero) exists between the flexible substrate 110 and the cover layer 160. Therefore, the cover layer 160 may include a material having an elastic modulus higher than that of the flexible substrate 110, such that the signal transmission line 140 provided in the bending portion 103 of the flexible display panel 100 may be disposed on the neutral plane. Therefore, since the signal transmission line 140 is disposed on the neutral plane between the cover layer 160 and the flexible substrate 110, bending stress of 0 (zero) is given to the signal transmission line 140 when the bending portion 103 of the flexible display panel 100 is bent at a predetermined curvature, whereby the bending portion 130 can be bent without being damaged by bending stress.

As described above, the bending portion 103 of the flexible display panel 100 is bent in a curved shape and the rear surface of the second back plate 330 is arranged at the rear edge portion of the first back plate 310 adjacent to the opening portion 301, as shown in FIG. 4, whereby the flexible display device according to one embodiment has a bezel width BW and a thin thickness.

In the flexible display device according to one embodiment of the present invention, as the bending portion 103 of the flexible display panel 100 is bent in a curved shape, gap space GS is provided between each of the first and second buffer members 510, 530 and the bending portion 103 bent in a curved shape. The gap space GS serves to prevent external stress, which is given to the bending portion 103 bent in a curved shape, from occurring.

In more detail, the gap space GS is provided between the bending portion 103 bent in a curved shape by the opening portion 301 of the back plate 300 and the buffer member 500. The gap space GS forms air gap between an inner curvature portion of the bending portion 103 bent in a curved shape and the buffer member 500, whereby external stress is not given to the bending portion 103, and external stress is not given thereto due to contaminants. Therefore, external stress given to the bending portion 103 bent in a curved shape may be almost zero (0). If the bending portion 103 bent in a curved shape is in contact with the buffer member 500, external stress may be applied to the bending portion 103 due to the contact with the buffer member 500, and the neutral place formed in the bending portion 103 is moved towards the flexible substrate 110. For this reason, a crack may occur in the signal transmission line 140 due to bending stress of the bending portion 103. Therefore, the gap space GS allows the neutral plane formed in the bending portion 103 to be placed in the signal transmission line 140 by shielding external stress applied to the bending portion 103 bent in a curved shape. In this way, a crack is prevented from occurring in the signal transmission line 140 due to external stress and/or bending stress given to the bending portion 103.

In the flexible display device according to the embodiments, the panel driving circuit 200 is arranged on the rear surface of the first back plate 310 as the bending portion 103 of the flexible display panel 100 is bent in a curved shape. At this time, the panel driving circuit 200 may be attached to the rear surface of the first back plate 310 by a first adhesive member 400. In this case, one surface of the first adhesive member 400 may be coupled with the rear surface of the printed circuit board 250, and the other surface of the first adhesive member 400 may be coupled with the rear surface of the first back plate 310. For example, the first adhesive member 400 may be a double sided tape or foam tape, which has elasticity for impact absorption. In other embodiments, the first adhesive member 400 is a single sided tape attached to a side of the printed circuit board 250 facing away from the flexible display panel and the first back plate 310.

Additionally, the second back plate 330 is arranged on the rear surface of the first back plate 310 as the bending portion 103 of the flexible display panel 100 is bent in a curved shape. At this time, the rear surface of the second back plate 330 is in contact with the rear edge portion of the first back plate 310, whereby the thickness of the flexible display device is reduced. In this case, the second back plate 330 may be coupled with the rear edge portion of the first back plate 310 by a second adhesive member 450. One surface of the second adhesive member 450 may be coupled with the rear surface of the second back plate 330, and the other surface of the second adhesive member 450 may be coupled with the rear surface of the first back plate 310. For example, the second adhesive member 450 may be an adhesive or double sided tape.

When the bending portion is bent, the first back plate 310 and the second back plate 330 are parallel. Further, the second back plate 330 extends over the first back plate 310 and the flexible substrate 110 by distance OL corresponding to a width of the second back plate 310. Distance OL or the width of the second back plate 310 is larger than bezel width BW of the flexible substrate 110.

Figure 5:
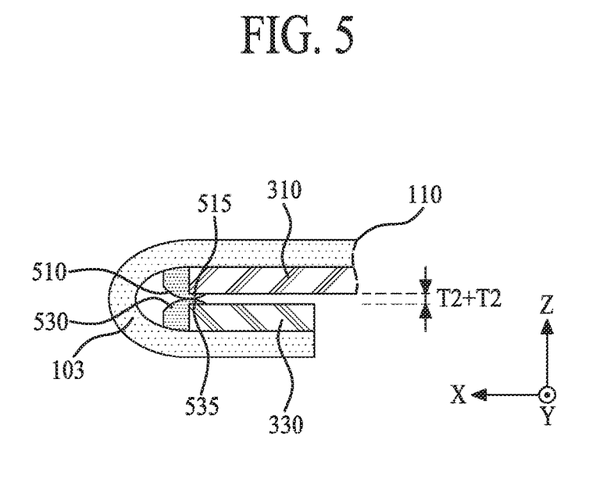
FIG. 5 is a sectional diagram illustrating an extension portion in a bending state of a flexible display panel according to one embodiment.

Meanwhile, if the first and second buffer members 510 and 530 include extension portions 515 and 535, respectively, as shown in FIG. 5, the rear surface of the second back plate 330 is spaced apart from the rear surface of the first back plate 310 as much as a thickness sum (T2+T2) of the extension portions 515 and 535. Therefore, in the present invention, physical interference between the rear surface of the second back plate 330 and the rear surface of the first back plate 310 can be minimized through the extension portions 515 and 535 of the first and second buffer members 510 and 530, and external impact between the first and second back plates 310 and 330 can be buffered. In this case, the second adhesive member 450 may additionally be arranged on the gap space between the rear surface of the second back plate 330 and the rear surface of the first back plate 310.

As described above, the inner sides 311 and 331 of the back plate 300 provided by the opening portion 301 overlapped with the bending portion 103 of the flexible display panel 100 are covered by the buffer member 500, whereby the flexible display device according to one embodiment of the present invention may have a narrow bezel width BW and a thin thickness in accordance with bending guide and buffering of the buffer member 500. Also, as the flexible substrate 110 may be prevented from being scratched through the buffer member 500 during bending of the bending portion 103, bending stress concentrated on the bending portion 103 of the flexible substrate 110 is reduced, whereby reliability may be improved, and separation between the flexible substrate 110 and the back plate 300 may be prevented from occurring through the buffer member 500. Moreover, water may be prevented from permeating into the portion between the flexible substrate 110 and the back plate 300, whereby reliability may be more improved.

Figure 6:
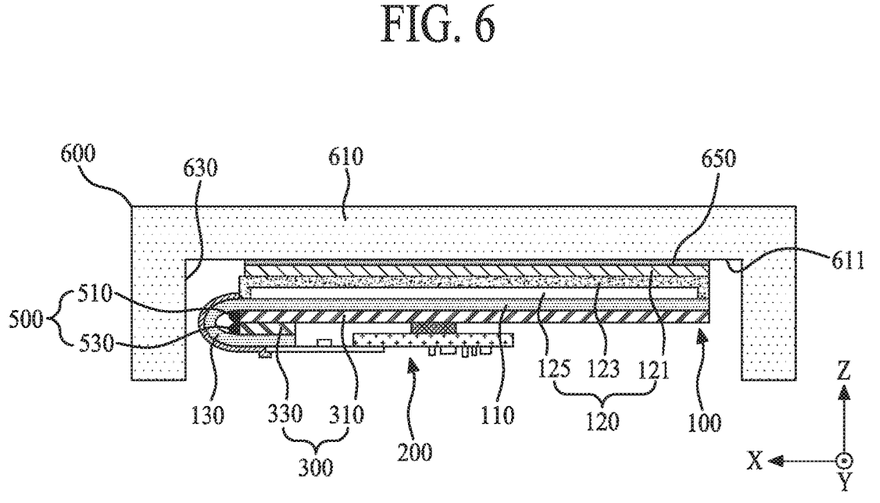
FIG. 6 is a sectional diagram illustrating a flexible display device according to another embodiment.

FIG. 6 is a diagram illustrating a flexible display device according to another embodiment of the present invention. Referring to FIG. 6, the flexible display device according to another embodiment of the present invention includes a flexible display panel 100, a back plate 300, a buffer member 500, and a cover window 600. This flexible display device according to the embodiment of FIG. 6 is that the cover window 600 is further included in the flexible display device shown in FIGS. 1 to 5. Therefore, the cover window 600 and its related elements will be described below, and repeated description of the other elements the same as those of FIGS. 1 to 5 will be omitted herein for the sake of brevity.

The cover window 600 covers a front surface and a side surface of the flexible display panel 100. The cover window 600 according to one embodiment includes a front cover 610 and a side cover 630, for example may include a cap shape. The front cover 610 is formed in a flat shape to cover the front surface of the flexible display panel 100. The side cover 630 is provided on a rear surface of both edge portions of the front cover 610 to cover the side of the flexible display panel 100.

The cover window 600 serves to protect the flexible display panel 100 from external impact. To this end, the cover window 600 according to one embodiment may include at least one of Sapphire Glass and Gorilla Glass. The cover window 600 according to another embodiment may include any one material of PET(polyethyleneterephthalate), PC(polycarbonate), PES(polyethersulfone), PEN(polyethylenapthanate), and PNB(polynorborneen). The cover window 600 is preferably made of tempered glass as above in consideration of scratch and transparency.

A front surface of the pixel array portion 120 provided on the flexible display panel 100, that is, the display portion of the flexible substrate 110 may be bonded to a lower surface 611 of the front cover 610 of the cover window 600 through a direct bonding process that uses a transparent adhesive member 650. In this case, the transparent adhesive member 650 may include PSA (pressure sensitive adhesive), OCA (optical clear adhesive) or OCR (optical clear resin).

Figure 7:
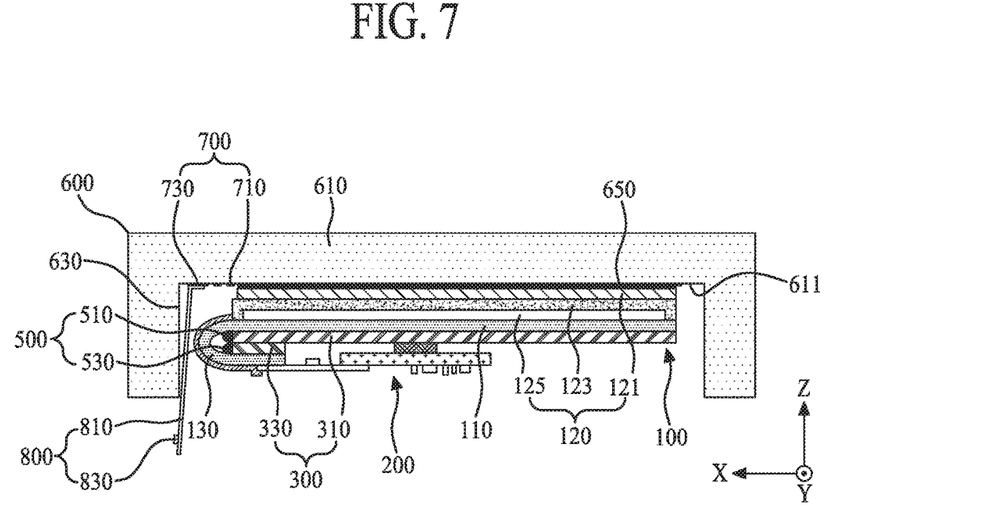
FIG. 7 is a sectional diagram illustrating a flexible display device according to another embodiment.

FIG. 7 is a diagram illustrating a flexible display device according to another embodiment of the present invention. Referring to FIG. 7, the flexible display device includes a flexible display panel 100, a back plate 300, a buffer member 500, a cover window 600, a touch electrode portion 700, and a touch driving circuit portion 800. The flexible display device according to other embodiment is that the touch electrode portion 700 and the touch driving circuit portion 800 are further included in the flexible display device shown in FIG. 6. Therefore, the touch electrode portion 700 and the touch driving circuit portion 800 and their related elements will be described herein, and repeated description of the other elements the same as those of FIG. 6 will be omitted for the sake of brevity.

The touch electrode portion 700 is arranged between the cover window 600 and the flexible display panel 100 and serves as a touch sensor that senses a user touch for the cover window 600. The touch electrode portion 700 according to the embodiment of FIG. 7 includes a plurality of touch driving electrodes 710 provided on a lower surface 611 of the cover window 600 at constant intervals, a plurality of touch sensing electrodes (not shown) electrically insulated from the plurality of touch driving electrodes 710, and a touch pad portion 730 connected to each of the plurality of touch driving electrodes 710 and the plurality of touch sensing electrodes. Additionally, the touch electrode portion 700 according to one embodiment further includes a dielectric layer (or insulating layer) for forming capacitance between the touch driving electrode and the touch sensing electrode.

The touch electrode portion 700 according to another embodiment includes a touch panel of a capacitance type which is well-known, and may be attached to the lower surface of the cover window 600 or an upper surface of the flexible display panel 100.

The touch driving circuit portion 800 is connected to the touch pad portion 730 and applies a touch driving pulse to the plurality of touch driving electrodes 710, and generates touch sensing data for a user touch by sensing a change of capacitance formed between the touch driving electrode and the touch sensing electrode.

The touch driving circuit portion 800 according to one embodiment includes a touch flexible circuit film 810 and a touch driving integrated circuit 830. The touch flexible circuit film 810 is attached to the touch pad portion 730 provided on the lower surface 611 of the front cover 610 of the cover window 600 through a film attachment process. The touch flexible circuit film 810 is bent from the touch pad portion 830 and arranged between a side cover 630 of the cover window 600 and a side of the flexible display panel 100.

The touch driving integrated circuit 830 is packaged in the touch flexible circuit film 810 by a chip bonding process or surface packaging process. The touch driving integrated circuit 830 generates touch driving pulses on the basis of a touch enable signal supplied from an external display driving system to apply the touch driving pulse to the plurality of touch driving electrodes 710, senses a change of capacitance formed between the touch driving electrode and the touch sensing electrode through the touch sensing electrode, and generates touch sensing data corresponding to the sensed change of capacitance to provide the generated touch sensing data to a display driving system. The display driving system generates 2-dimensional touch information or 3-dimensional touch information on the basis of the touch sensing data, and runs an application program corresponding to the 2-dimensional touch information or 3-dimensional touch information.

Selectively, the touch driving integrated circuit 830 may be built in a printed circuit board of the display driving system or the panel driving circuit 200 without being packaged in the touch flexible circuit film 810. In this case, the touch flexible circuit film 810 serves to relay signal transmission between the touch pad portion 730 and the display driving system.

FIG. 8 is a flowchart illustrating a process of fabricating a flexible display device, according to one embodiment. First, a pixel array portion 120 is provided 810 on a first side of a display portion 101 of a flexible substrate 110.

A first back plate 310 is provided 814 on a first portion of a second side of the flexible substrate 110 in the display portion 101 but not on a second portion of the second side of the flexible substrate 110 in a bending portion 103 connected to the display portion 101. In one embodiment, the first and second back plates 310, 330 are formed by laminating material on the second side of the flexible substrate 110, and then removing the laminated material from the bending portion 103.

Then, a first buffer member 311 and a second buffer member 331 extending into the bending portion from sides of the first and second back plate 310, 330 are provided 818 on the second side of the flexible substrate 110. In one embodiment, the first and second buffer members 311, 331 are formed by coating the sides of the first and second back plates 310, 330 with a polymer material, and then hardening the polymer material into a predetermined shape.

A flexible circuit film 210 is attached 822 to a circuit connection portion 105 of the flexible substrate connected to the bending portion 103.

The bending portion 103 is bent 826 so that the first portion of the second side of the flexible substrate 110 faces a third portion of the second side of the flexible substrate 110 in the circuit connector portion 105 with the first and second buffer members 311, 331 between the first portion and the third portion of the second side of the flexible substrate 110.

As described above, the flexible display device according to the present invention can be applied portable electronic devices such as mobile communication terminals, electronic diaries, electronic books, PMPs, navigators, UMPCs, mobile phones, smart phones, tablet PCs, and watch phones. Since a separate support member for bending of the bending portion of the flexible display panel is not required in the present invention, the bezel width and thickness of the flexible display device can be reduced.

Also, scratch of the flexible substrate can be avoided by bending guide and buffering of the buffer member during bending of the flexible display panel, and reliability of the flexible display device can be improved by reducing bending stress concentrated on the bending portion of the flexible substrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flexible display device comprising:
    a flexible substrate comprising a flat display portion, a circuit connection portion and a bending portion between the flat display portion and the circuit connection portion;
    a pixel array portion on a first side of the flat display portion of the flexible substrate;
    a first back plate attached to a first portion of a second side of the flexible substrate in the flat display portion;
    a second back plate attached to a second portion of the second side of the flexible substrate in the circuit connection portion; and
    a first buffer member extending towards the bending portion from a side of the first back plate facing the bending portion and covering the entire side of the first back plate, the first buffer member defining an opening on the second side of the flexible substrate in the bending portion between the first back plate and the second back plate.

2. The flexible display device of claim 1, wherein the circuit connection portion comprises a pad portion configured to connect to a flexible circuit film, and wherein the bending portion is folded back so that the first portion of the second side of the flexible substrate faces the second portion of the second side of the flexible substrate.

3. The flexible display device of claim 2, wherein the first back plate and the second back plate are parallel when the bending portion is folded back, and the second back plate extends over a part of the second portion of the second side of the flexible substrate.

4. The flexible display device of claim 3, wherein a width of the second back plate is larger than a bezel width of the flexible substrate.

5. The flexible display device of claim 2, further comprising:
    a second buffer member extending into a part of the bending portion from a side of the second back plate, the second buffer member in conjunction with the first buffer member defining the opening.

6. The flexible display device of claim 5, wherein the first buffer member covers a portion of a rear surface of the first back plate, and the second buffer member covers a portion of a rear surface of the second back plate.

7. The flexible display device of claim 6, wherein a thickness of a portion of the first buffer member covering the portion of the rear surface of the first back plate is at most $\frac{1}{10}$ of a thickness of the first back plate.

8. The flexible display device of claim 5, wherein the first and second buffer members are formed by coating the side of the first back plate and the side of the second back plate with a polymer material and hardening the polymer material into predetermined shapes.

9. The flexible display device of claim 8, wherein the first and second buffer members include an anti-water permeable material to prevent water from permeating into the flexible substrate.

10. The flexible display device of claim 2, further comprising a printed circuit board connected to the pad portion via the flexible circuit film, wherein the printed circuit board is secured to the first back plate.

11. The flexible display device of claim 10, wherein the printed circuit board is secured to the first back plate by one of a foam tape, a double-sided tape or a single-sided tape.

12. The flexible display device of claim 10, wherein the printed circuit board is secured to the first back plate by an adhesive member between the printed circuit board and the first back plate.

13. The flexible display device of claim 1, further comprising:
    a signal transmission line in the bending portion; and
    a cover layer covering the signal transmission line in the bending portion.

14. The flexible display device of claim 13, wherein the cover layer extends over the circuit connection portion and the pixel array portion when the bending portion is bent.

15. The flexible display device of claim 14, further comprising a pixel array layer on the first side of the flat portion of the flexible substrate, an encapsulation layer on the pixel array layer and a barrier layer on the encapsulation layer, wherein the encapsulation layer contacts the cover layer.

16. The flexible display device of claim 1, further comprising an adhesive member between the first back plate and the second back plate.

17. The flexible display device of claim 1, further comprising a cover window having a front cover and side covers at both sides of the front cover,
   wherein the pixel array portion is bonded to a lower surface of the front cover, and the bending portion is bent in a curved shape and surrounded by the side covers.

18. The flexible display device of claim 17, further comprising a touch electrode portion arranged between the cover window and the pixel array portion.

19. A flexible display device comprising:
   a flexible substrate comprising a flat display portion, a circuit connection portion and a bending portion between the flat display portion and the circuit connection portion;
   a pixel array portion on a first side of the flat display portion of the flexible substrate;
   a first back plate attached to a first portion of a second side of the flexible substrate in the flat display portion;
   a second back plate attached to a second portion of the second side of the flexible substrate in the circuit connection portion; and
   a first buffer member extending towards the bending portion from a side edge of the first back plate facing the bending portion and covering the side edge of the first back plate, the first buffer member defining an opening on the second side of the flexible substrate in the bending portion between the first back plate and the second back plate,
   a second buffer member extending into a part of the bending portion from a side edge of the second back plate, the second buffer member in conjunction with the first buffer member defining the opening,
   wherein the first buffer member and the second buffer member are separated by a distance when the bending portion is not bent, and wherein the first buffer member and the second buffer member are in contact when the bending portion is bent.

20. The flexible display device of claim 19, wherein the circuit connection portion comprises a pad portion configured to connect to a flexible circuit film, and wherein the bending portion is folded back so that the first portion of the second side of the flexible substrate faces the second portion of the second side of the flexible substrate.

* * * * *